US012034040B2

(12) United States Patent
Weber et al.

(10) Patent No.: US 12,034,040 B2
(45) Date of Patent: Jul. 9, 2024

(54) SUPERJUNCTION TRANSISTOR DEVICE AND METHOD FOR FORMING A SUPERJUNCTION TRANSISTOR DEVICE

(71) Applicant: Infineon Technologies Austria AG, Villach (AT)

(72) Inventors: Hans Weber, Bayerisch Gmain (DE); Ingo Muri, Villach (AT); Daniel Tutuc, St. Niklas an der Drau (AT)

(73) Assignee: Infineon Technologies Austria AG, Villach (AT)

( * ) Notice: Subject to any disclaimer, the term of this patent is extended or adjusted under 35 U.S.C. 154(b) by 173 days.

(21) Appl. No.: 17/330,562

(22) Filed: May 26, 2021

(65) Prior Publication Data
US 2021/0376063 A1   Dec. 2, 2021

(30) Foreign Application Priority Data

May 27, 2020   (EP) ..................................... 20176749
Jul. 31, 2020   (EP) ..................................... 20188912

(51) Int. Cl.
*H01L 29/06*   (2006.01)
*H01L 21/225*   (2006.01)
(Continued)

(52) U.S. Cl.
CPC ...... *H01L 29/0634* (2013.01); *H01L 21/2253* (2013.01); *H01L 21/26513* (2013.01);
(Continued)

(58) Field of Classification Search
CPC ........... H01L 29/0634; H01L 21/26513; H01L 21/26586; H01L 21/324; H01L 29/66712; H01L 29/66734
See application file for complete search history.

(56) References Cited

U.S. PATENT DOCUMENTS 10,553,681 B2 * 2/2020 Weber ............... H01L 21/26586
2007/0177444 A1 8/2007 Miyajima
(Continued)

FOREIGN PATENT DOCUMENTS

CN   103828058 A   5/2014
CN   104752492 A   7/2015
(Continued)

*Primary Examiner* — Bilkis Jahan
*Assistant Examiner* — Victor V Barzykin
(74) *Attorney, Agent, or Firm* — Murphy, Bilak & Homiller, PLLC

(57) ABSTRACT

A method for forming a drift region of a superjunction transistor and a superjunction transistor device are disclosed. The method includes forming first regions of a first doping type and second regions of a second type in a semiconductor body such that the first and second regions are arranged alternatingly in the body. The first and second regions are formed by: forming trenches in at least one semiconductor layer; implanting first type dopant atoms and second type dopant atoms into opposing sidewalls of the trenches; filling the trenches with a semiconductor material; and diffusing the dopant atoms in a thermal process so that the first type dopant atoms form the first regions and the second type dopant atoms form the second regions. Each trench has a first width, the trenches are separated by mesa regions each having a second width, and the first width is greater than the second width.

9 Claims, 10 Drawing Sheets

(51) Int. Cl.

| | | |
|---|---|---|
| *H01L 21/265* | (2006.01) | |
| *H01L 21/324* | (2006.01) | |
| *H01L 29/08* | (2006.01) | |
| *H01L 29/66* | (2006.01) | |
| *H01L 29/78* | (2006.01) | |
| *H01L 21/223* | (2006.01) | |
| *H01L 21/306* | (2006.01) | |
| *H01L 29/16* | (2006.01) | |
| *H01L 29/167* | (2006.01) | |

(52) U.S. Cl.
CPC ...... *H01L 21/26586* (2013.01); *H01L 21/324* (2013.01); *H01L 29/0684* (2013.01); *H01L 29/0696* (2013.01); *H01L 29/0878* (2013.01); *H01L 29/66666* (2013.01); *H01L 29/66712* (2013.01); *H01L 29/66734* (2013.01); *H01L 29/7802* (2013.01); *H01L 29/7805* (2013.01); *H01L 29/7827* (2013.01); *H01L 21/223* (2013.01); *H01L 21/30604* (2013.01); *H01L 29/1608* (2013.01); *H01L 29/167* (2013.01); *H01L 29/7813* (2013.01)

(56) References Cited

U.S. PATENT DOCUMENTS

| | | |
|---|---|---|
| 2014/0151758 A1 | 6/2014 | Meiser et al. |
| 2016/0268367 A1 | 9/2016 | Ishiguro et al. |
| 2018/0090479 A1* | 3/2018 | Weyers ............... H01L 29/7823 |
| 2018/0374741 A1* | 12/2018 | Tutuc .................. H01L 29/7802 |
| 2019/0058038 A1* | 2/2019 | Weber ................ H01L 29/1095 |
| 2019/0288061 A1 | 9/2019 | Weber |
| 2020/0176559 A1 | 6/2020 | Weber |

FOREIGN PATENT DOCUMENTS

| | | |
|---|---|---|
| CN | 105895709 A | 8/2016 |
| CN | 107623038 A | 1/2018 |
| DE | 102007026745 A1 | 12/2008 |
| JP | 2011051885 A | 3/2011 |

* cited by examiner

SUPERJUNCTION TRANSISTOR DEVICE AND METHOD FOR FORMING A SUPERJUNCTION TRANSISTOR DEVICE

TECHNICAL FIELD

This disclosure in general relates to a superjunction transistor device and a method for forming a superjunction transistor device, in particular, for forming a drift region of a superjunction transistor device.

BACKGROUND

A superjunction device includes a drift region with at least one first region of a first doping type (conductivity type) and at least one second region of a second doping type (conductivity type) complementary to the first doping type. In some publications, the at least one first doping type region is referred to as drift region and the at least one second doping type region is referred to as compensation region.

The drift region of a superjunction device may include a plurality of first regions and second regions which are alternatingly arranged in a semiconductor body. There is a need for forming such drift region in a cost efficient way.

SUMMARY

One example relates to a method. The method includes forming a plurality of first regions of a first doping type and a plurality of second regions of a second type in a semiconductor body such that the first regions and the second regions are arranged alternatingly in the semiconductor body. In this method, forming the first regions and the second regions includes forming a plurality of trenches in at least one semiconductor layer, implanting first type dopant atoms and second type dopant atoms into each of opposing sidewalls of the plurality of trenches, filling the plurality of trenches with a semiconductor material, and diffusing the first type dopant atoms and second type dopant atoms in a thermal process so that the first type dopant atoms form the first regions and the second type dopant atoms form the second regions. Each of the plurality of trenches has a first width and the trenches are separated by mesa regions each having a second width, wherein the first width is greater than the second width.

Another example relates to a superjunction transistor device. The transistor device includes a drift region with a plurality of first regions of a first doping type and a plurality of second regions of a second type in a semiconductor body, wherein the first regions and the second regions are arranged alternatingly in the semiconductor body. The second regions include wide regions having a first width and narrow regions having a second width, wherein the wide regions and the narrow regions are arranged alternatingly, and wherein the first width is at least 1.05 times the second width.

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
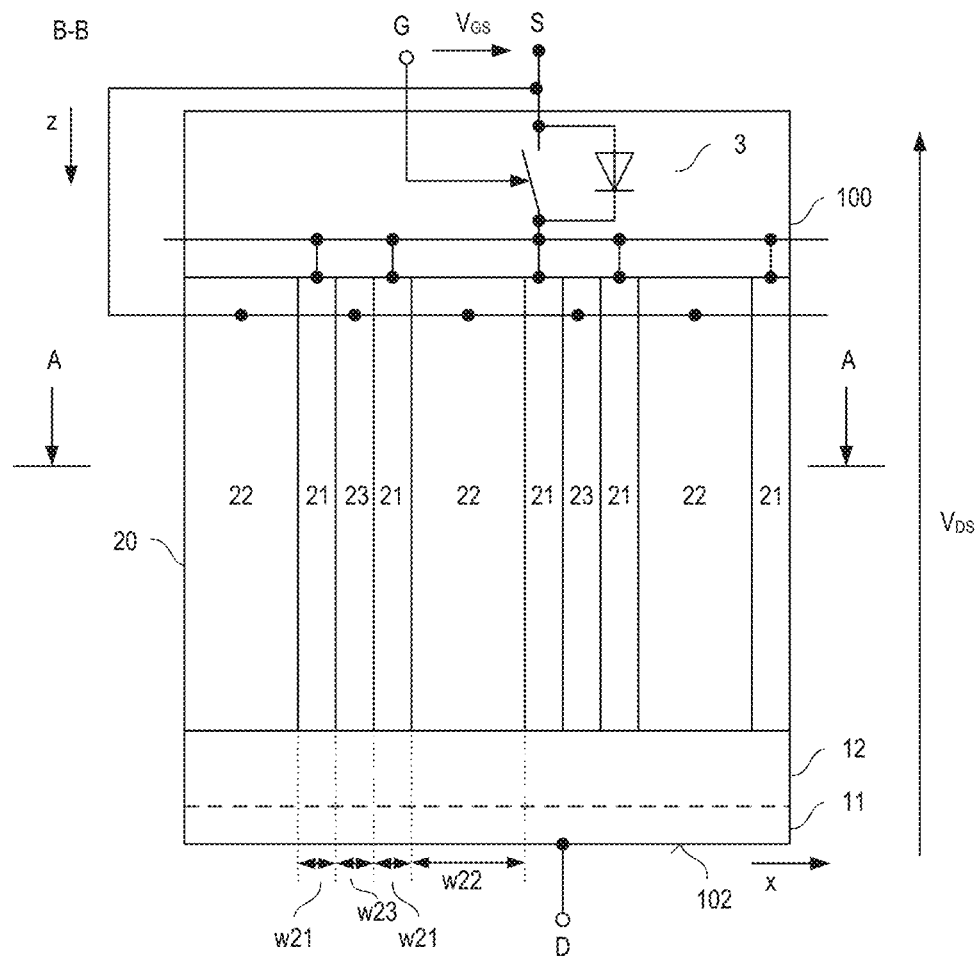
FIG. 1 shows a vertical cross sectional view of a superjunction transistor device according to one example.

FIG. 1 schematically illustrates a sectional view of one section of a superjunction transistor device. The transistor device includes a semiconductor body 100, wherein the semiconductor body 100 may include a conventional semiconductor material such as, for example, silicon (Si), or silicon carbide (SiC). The transistor device, in the semiconductor body 100, includes a drift region 20 with a plurality of first regions 21 of a first doping type (conductivity type) and a plurality of second regions 22, 23 of a second doping type (conductivity type) complementary to the first doping type. The first regions 21 and the second regions 22, 23 are arranged alternately in the semiconductor body 100, and a pn-junction is formed between each first region 21 and a corresponding adjoining second region 22, 23. Just for the purpose of illustration, in the example shown in FIG. 1, the first regions 21 and the second regions 22, 23 are arranged alternately in a first lateral direction x of the semiconductor body 100.

Referring to FIG. 1, the second regions 22, 23 include two different types of second regions, wide regions 22 and narrow regions 23, wherein the wide regions 22 and the narrow regions 23 are arranged alternatingly. In each case, a wide region 22 and a neighboring narrow region 23 are separated by a respective first region 21. The transistor device with the wide regions 22 and the narrow regions 23 of the second doping type can be produced in an efficient way, which will be explained in detail herein further below.

The wide regions 22 have a first width w22 and the narrow regions 23 have a second width w23 that is smaller than the first width w22. According to one example, the first width w22 is at least 1.05 times the second width w23, w22≥1.05*w23. According to one example, the first width w22 is at least 1.1 times or at least 1.2 times the second width w23. According to one example, the first width w22 is less than 5 times, less than 4, or less than 2 times the second width w23.

Referring to FIG. 1, each of the first regions 21 and the second regions 22, 23 extends in a vertical direction z of the semiconductor body, wherein the vertical direction z is essentially perpendicular to the first lateral direction x. A dimension of the first and second regions 21, 22, 23 in the vertical direction is, inter alia, dependent on a desired voltage blocking capability of the transistor device and is selected from between several 10 micrometers and several 100 micrometers, for example.

The respective width w22, w23 of each of the second regions 22, 23 may vary along the vertical direction z, which may be due to the manufacturing process. Further, the widths w22 of individual wide regions 22 may slightly deviate from each other, and the widths w23 of individual wide regions 22 may slightly deviate from each other. Thus, according to one example, the width w22 of a single wide region 22 denotes the average width of this wide region, and the width w22 of the plurality of wide regions 22 denotes the average width of the average widths of the wide regions 22. Equivalently, the width w23 of a single narrow region 23 denotes the average width of this narrow region, and the width w23 of the plurality of narrow regions 23 denotes the average width of the average widths of the narrow regions 23. Consequently, a width w21 of a single first region 21 denotes the average width of this first region, and the width w21 of the plurality of first regions 21 denotes the average width of the average widths of the first regions 21.

According to one example, the transistor device is implemented in such a way that, at each vertical position of the semiconductor body 100, an effective dopant dose of second type dopant atoms in the wide regions 22 deviates less than 10%, less than 5%, or less than 1% from an effective dopant dose of second type dopant atoms in the narrow regions 23. The "effective dopant dose" at a vertical position of a second region 22, 23 is the integral of the effective (net) doping concentration of the second region 22, 23 in a direction perpendicular to one of the pn-junctions formed between the second region 22, 23 and the neighboring first region 21.

Figure 2:
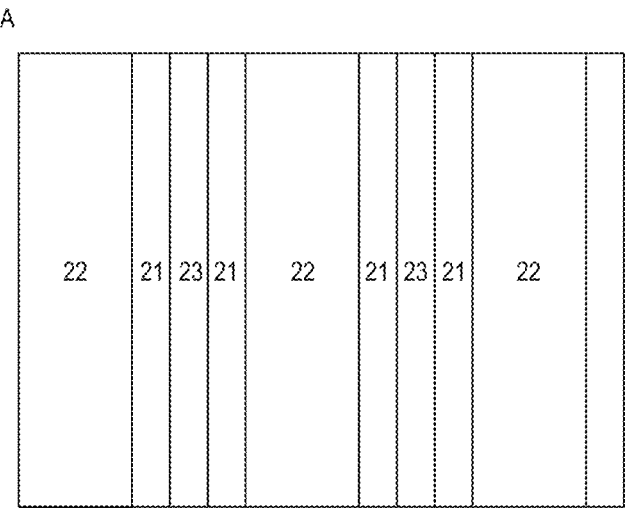
FIG. 2 shows a horizontal cross sectional view of one example of a drift region of the superjunction transistor device.

The first and second regions 21, 22, 23 may be elongated in a second lateral direction y of the semiconductor body 100. This is illustrated in FIG. 2 that shows a horizontal cross sectional view of the semiconductor body in a horizontal section plane A-A, which is a section plane perpendicular to the vertical section plane shown in FIG. 1. The second lateral direction y is essentially perpendicular to the first lateral direction x, according to one example. "Elongated" means that a length of the first and second regions 21, 22, 23 is significantly greater than the respective width w21, w22, w23. In the examples shown in FIGS. 1 and 2, the width w21, w22, w23 is the dimension in the first lateral direction x and the "length" is the dimension in the second lateral direction y of the semiconductor body 100. According to one example, "significantly greater" means that a ratio between the length and the width is greater than 10, greater than 100, or even greater than 1000.

Referring to FIG. 1, the first regions 21 are connected to a drain node D of the transistor device, and the second regions 22, 23 are connected to a source node S of the transistor device. A connection between the second regions 22, 23 and the source node S is only schematically illustrated in FIG. 1. Examples of how these connections can be implemented are explained with reference to examples herein further below. The first regions 21 are connected to the drain node D via a drain region 11 of the first doping type. The drain region 11 may adjoin the first regions 21. This, however, is not shown in FIG. 1.

Optionally, as shown in FIG. 1, a buffer region 12 of the first doping type is arranged between the drain region 11 and the first regions 21. The buffer region 12 has the first doping type, which is the doping type of the drift regions 21 and the drain region 11. According to one example, a doping concentration of the buffer region 12 is lower than a doping concentration of the drain region 11. The doping concentration of the drain region 11 is selected from a range of between 1E17 (=$10^{17}$) cm$^{-3}$ and 1E20 cm$^{-3}$, for example, and the doping concentration of the buffer region 12 is selected from a range of between 1E14 cm$^{-3}$ and 1E17 cm$^{-3}$, for example. According to one example, the buffer region 12 includes two or more differently doped sub-regions (not shown). One of these sub-regions may have a doping concentration of between 1E14 cm$^{-3}$ and 5E15 cm$^{-3}$, and another one of these sub-regions may have a doping concentration of between 5E15 cm$^{-3}$ and 1E17 cm$^{-3}$.

Referring to FIG. 1, the transistor device further includes a control structure 3 connected between the source node S and the first regions 21. The control structure 3 is at least partially integrated in a semiconductor body 100. Examples of how the control structure 1 may be implemented are explained with reference to examples herein further below. The control structure furthermore includes a gate node G and is configured to control a conducting channel between the source node S and the first regions 21 dependent on a voltage $V_{GS}$ between the gate node G and the source node S. In the example shown in FIG. 1, this function of the control structure 1 is represented by a switch connected between the source node S and the first regions 21. Furthermore, the control structure 1 includes a pn-junction between the first regions 21 and the source node S. In the example shown in FIG. 1, this pn-junction is represented by a bipolar diode connected between the first regions 21 and the source node S.

The transistor device has a current flow direction, which is a direction in which a current may flow between the source node S and the drain node D inside the semiconductor body 100. In the example shown in FIG. 1, the current flow direction corresponds to the vertical direction z of the semiconductor body 100, so that the drain region 11 is spaced apart from the control structure 3 in the vertical direction. The vertical direction z is a direction perpendicular to a first surface (not shown in FIG. 1) and a second surface 102 that is formed by the drain region 11. The "vertical cross sectional view" illustrated in FIG. 1 is a sectional view in a section plane perpendicular to the first surface and the second surface 102 and parallel to the vertical direction z. Section planes perpendicular to the vertical section plane shown in FIG. 1 are referred to as horizontal section planes.

The transistor device can be operated in a forward biased state and a reverse biased state. Whether the device is in the forward biased state or the reverse biased state is dependent on a polarity of a drain-source voltage Vim, which is a voltage between the drain node D and the source node S. In the reverse biased state the polarity of the drain-source voltage $V_{DS}$ is such that the diode of the control structure 3 (which may also be referred to as body diode) is forward biased, so that in this operation state the transistor device conducts a current independent of an operation state of the control structure 3. In the forward biased state, the polarity of the drain-source $V_{DS}$ is such that the diode of the control structure 3 is reverse biased. In this forward biased state, the transistor device can be operated in an on-state or an off-state by the control structure 3. In the on-state, the control structure 3 generates a conducting channel between the source node S and the first regions 21 so that a current can flow between the source node S and the drain node D via the control structure 3 and the first regions 21 of the first doping type. In the off-state the conducting channel is interrupted.

In the off-state, space charge regions (depletion regions) expand in the first regions 21 and the second regions 22, 23, so that the first regions 21 and the second regions 22, 23 may become depleted of charge carriers as the drain-source voltage $V_{DS}$ increases. In this way, charge carriers in the first regions 21 are "compensated" by charge carriers in the second regions 22, 23. Thus, as compared to a conventional transistor device that is devoid of the second regions, the first regions 21 can be implemented with a higher doping concentration and, therefore, a lower resistance without decreasing the voltage blocking capability of the transistor device.

Referring to the above, a drift region 20 and, therefore, a semiconductor device of the type shown in FIG. 1 can be produced in an efficient way. Examples of a method for producing the drift region 20 are explained in the following.

Figure 3:
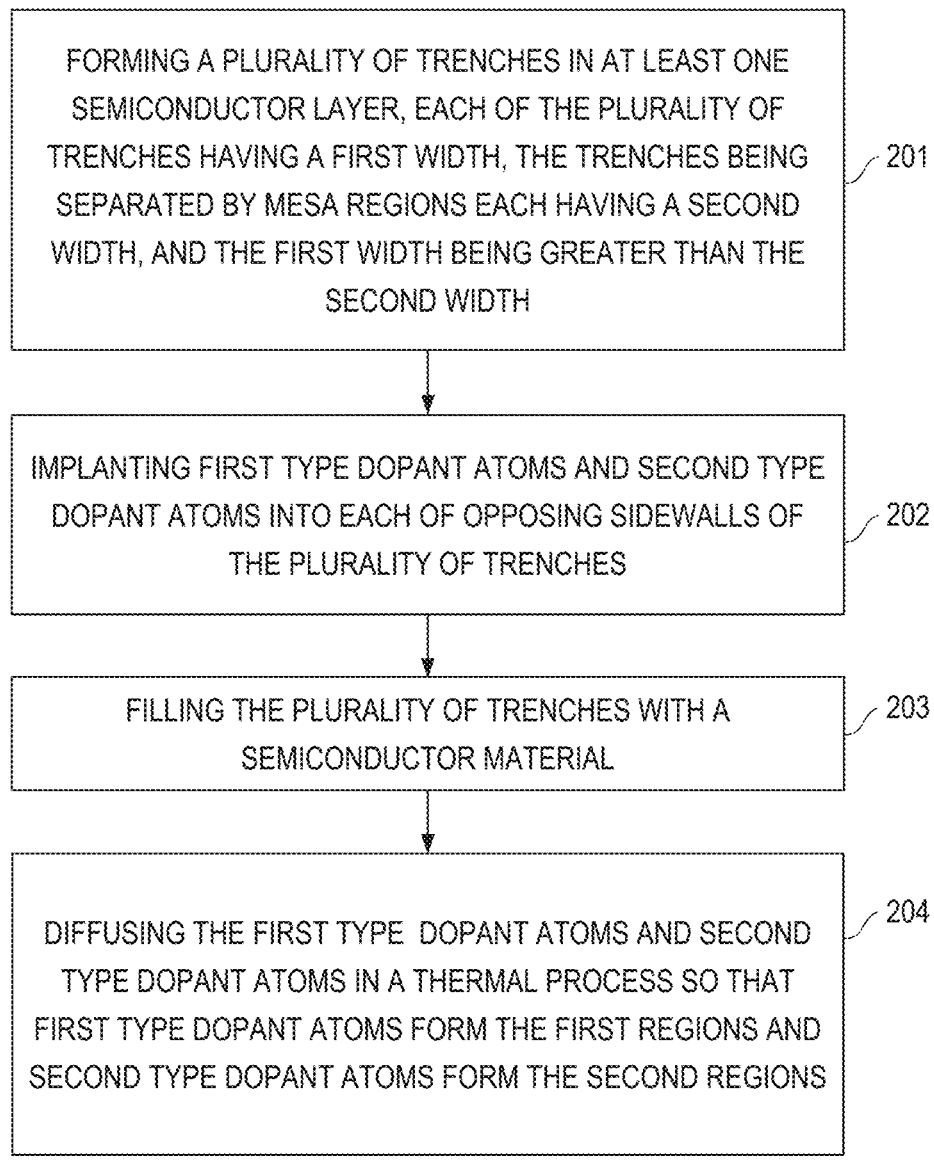
FIG. 3 shows a flowchart of one example of a method for forming the drift region.

FIG. 3 illustrates a flow chart of a method according to one example. Referring to FIG. 3, the method includes forming a plurality of trenches in at least one semiconductor layer, wherein each of the plurality of trenches has a first width, wherein the trenches are separated by mesa regions each having a second width, and wherein the first width is greater than the second width (201). The method further includes implanting first type dopant atoms and the second type dopant atoms into each of opposing sidewalls of the plurality of trenches (202), filling the plurality of trenches with a semiconductor material (203), and diffusing the first type dopant atoms and second type dopant atoms in a thermal process, so that first type dopant atoms form the first regions and second type dopant atoms form the second regions (204).

Figure 4A:
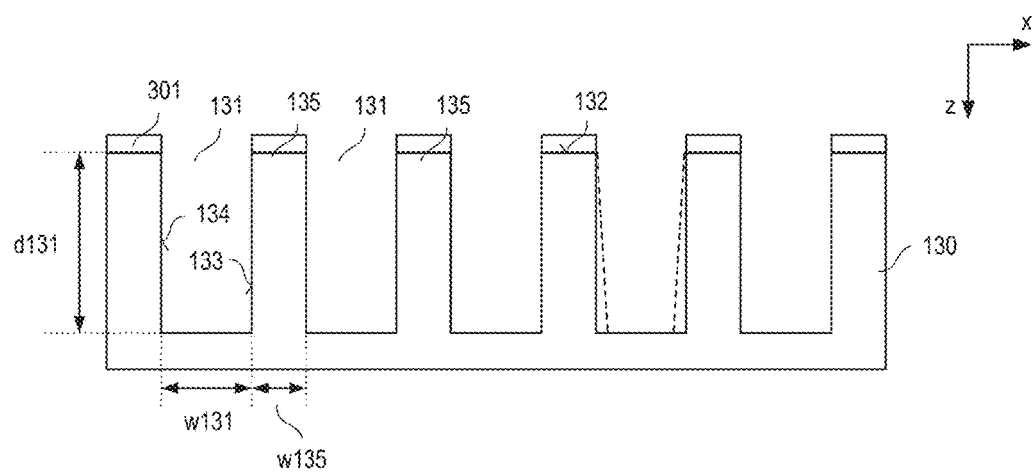
FIGS. 4A and 4B show a vertical cross sectional view of a first semiconductor layer during different process steps of a method for forming the drift region.
Figure 4B:
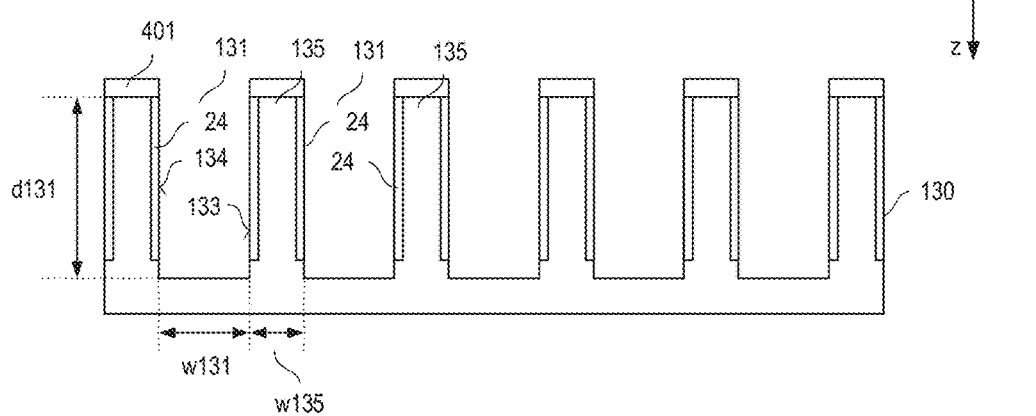

One example of forming the plurality of trenches and implanting the first type dopant atoms and second type dopant atoms into sidewalls of the trenches is illustrated in FIGS. 4A and 4B. Each of these figures shows a vertical cross sectional view of one section of a semiconductor layer 130 during the manufacturing process. This semiconductor layer 130 is also referred to as first semiconductor layer in the following. The first semiconductor layer 130 forms a portion of the semiconductor body 100 of the finished transistor device. At the time of processing the first semiconductor layer 130 further sections of the semiconductor body 100, such as the drain region 11 and the optional buffer region 12 may already have been formed. These further sections, however, are not illustrated in FIGS. 4A and 4B.

Referring to FIG. 4A, the method includes forming a plurality of trenches 131 in a first surface 132 of a semiconductor layer 130 such that each of these trenches 131 extends, from the first surface 132 into the semiconductor layer 130. Forming the trenches 131 may include forming an etch mask 301 on top of the first surface 132, and etching those sections of the semiconductor layer 130 that are not covered by the etch mask 301. Etching the trenches includes using an anisotropic etching process, for example. FIG. 4A shows the first semiconductor layer 130 after etching the trenches 131.

According to one example, the trenches 131 are elongated trenches. That is, a length of the trenches 131, which is the dimension of the trenches 131 in the second lateral direction y, is significantly greater than a width w131 of the trenches 131, which is a dimension of the trenches in the first lateral direction x.

Each of the trenches 131 has a first sidewall 133 and an opposing second sidewall 134, wherein these sidewalls extend in the longitudinal direction (the second lateral direction y) of the trenches 131 and at least approximately extend in the vertical direction z. "At least approximately" means that the sidewalls 133, 134 are at least approximately perpendicular to the first surface 132. That is, the sidewalls 133, 134 can be perpendicular to the first surface 101 or can be tapered. A tapered sidewall is illustrated in dashed lines in FIG. 4A. According to one example, an angle (inside the first semiconductor layer 130) between each of the sidewalls 133, 134 and the first surface 132 is between 90° and 100°, in particular, between 92° and 95°.

Referring to FIG. 4A, the trenches 131 are separated by mesa regions 135, so that each mesa region 135 is located between a respective pair of two neighboring trenches 131. Each of the mesa regions 135 has a width w135, which is a dimension of the respective mesa region 135 in the first lateral direction x. The width w131 of the trenches 131 is also referred to as first width in the following, and the width 135 of the mesa regions 135 is also referred to as second width in the following. Referring to the above, the trenches 131 and, consequently, the mesa regions 135 can be tapered. According to one example, the first width w131 of one trench denotes an average width of the respective trench 131, and the first width w131 of the plurality of trenches 131 denotes an average of the average widths of the trenches 131. Equivalently, the width w135 of one mesa region 135 denotes an average width of the respective mesa region 135, and the width w135 of the plurality of mesa regions 135 denotes an average of the average widths of the mesa regions 135.

The first width w131 is greater than the second width w135, w131>w135. According to one example, the first width 131 is at least 1.1 times, at least 1.2 times, or at least 1.5 times the second width w135, so that the trenches 131, in the first lateral direction x, are wider than the mesa regions 135. According to one example, the first width w131 is less than three times the second width 135, w131<3*w135. According to one example, the first width w131 is between 0.5 micrometers (µm) and 6 micrometers, in particular between 1.5 micrometers and 3.5 micrometers.

An aspect ratio a131 of the trenches 131 is given by a ratio between a depth d131, which is the dimension of the trenches in the vertical direction z, and the first width w131, $$a131 = \frac{d131}{w131}. \tag{1}$$

While it may be desirable to form the trenches 131 with a high aspect ratio, the aspect ratio is usually limited by the process that fills the trenches 131 with the semiconductor material. It may be desirable to produce the semiconductor material that fills the trenches 131 as a monocrystalline layer without any defects, such as voids. The higher the aspect ratio, the more difficult it is to fill the trenches 131 with a defect-free semiconductor material. Thus, according to one example, the trenches 131 are formed such that their aspect ratio a131 is between 2:1 and 3:1.

A pitch p of the trench structure shown in FIG. 4A is given by the first width w131 plus the second width w135, that is, the pitch is defined by one of the trenches 131 and an adjoining mesa region 135, $$p = w131 + w135 \quad (2).$$

This pitch of the trench structure essentially equals a center distance between two neighboring narrow regions 23 or a center distance between two neighboring wide regions 22 in the finished superjunction transistor device.

At a given pitch p of the trench structure and at a given aspect ratio a131 of the trenches 131, implementing the trenches 131 such that the first width w131 is greater than the second width w135 has the effect that deeper trenches can be formed as compared to a scenario in which the first width w131 equals the second width w135. The benefit of forming deeper trenches 131 is explained herein further below.

Referring to FIG. 4B, the method further includes implanting first type dopant atoms and second type dopant atoms into each of the opposing first and second sidewalls 133, 134 in order to form implanted regions 24 in the mesa regions 135 along the sidewalls 133, 134 such that each of these implanted regions 24 includes both dopant atoms of the first doping type and dopant atoms of the second doping type. Forming the implanted regions 24 may include tilted implantation processes, wherein an implantation mask 401 formed on top of the mesa regions 135 may prevent dopant atoms from being implanted into the first surface 132. According to one example, the implantation mask 401 is the etch mask 301.

Filling the plurality of trenches 131 with a semiconductor material and diffusing the first type dopant atoms and second type dopant atoms in accordance with process steps 202 and 203 (see, FIG. 2) is explained with reference to FIGS. 5A and 5B. Each of these figures shows the structure shown in FIG. 4B after further process steps.

Figure 5A:
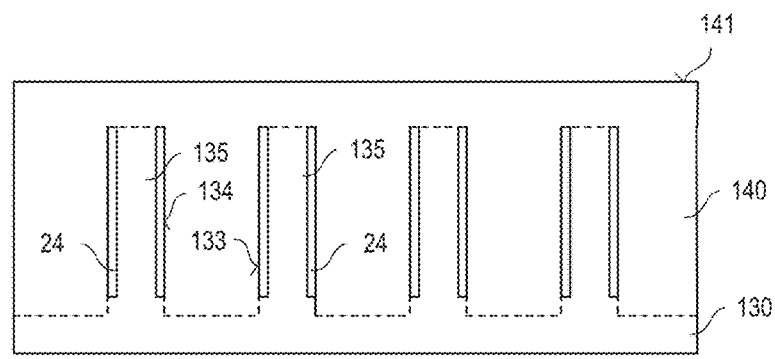
FIGS. 5A and 5B illustrate the first layer shown in FIGS. 4A and 4B after further process steps that include forming a top layer.

FIG. 5A shows the semiconductor layer 130 after filling the trenches 131 with a semiconductor material. Filling the trenches may include epitaxially growing a second semiconductor layer 140 on top of the first semiconductor layer 130 such that the trenches are completely filled. Referring to FIG. 5A, the second semiconductor layer 140 may be formed such that it fills the trenches and additionally covers the first surface 131 of the first semiconductor layer 130 on top of the mesa regions 135. Optionally, filling the trenches include a planarization process in which a surface 141 of the second semiconductor layer 140 is planarized and/or in which a thickness of the second semiconductor layer 140 above the mesa regions 135 is reduced. According to one example (not illustrated), the second semiconductor layer 140 is planarized or etched back down to the mesa regions 135, so that only sections of the second semiconductor layer 140 remain that fill the trenches 131. Thus, the semiconductor layer 140 is formed such that it at least fills the trenches 131 and, optionally, is also formed on top of the mesa regions 135.

Epitaxially growing the second semiconductor layer 140 results in a monocrystalline layer arrangement including the first layer 130 and the second layer 140. In this arrangement, there is no visible boarder between the first and second layer 130, 140. Nevertheless, just for the purpose of illustration, the border between the two semiconductor layers 130, 140 are illustrated in dashed lines in FIG. 5A.

Figure 5B:
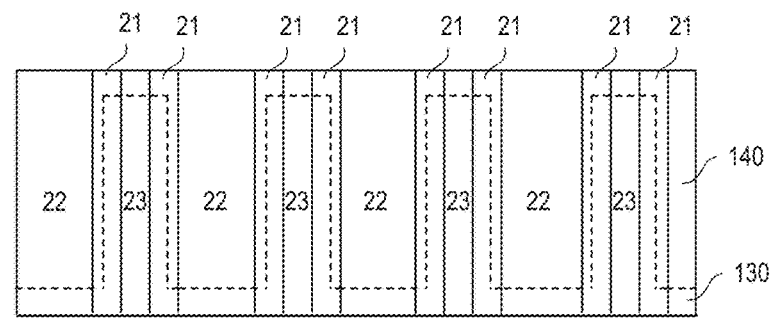

FIG. 5B shows the layer arrangement shown in FIG. 5A after a thermal process in which the first type dopant atoms and the second type dopant atoms included in the implanted regions 24 diffuse so that first type dopant atoms form the first regions 21 and second type dopant atoms form the second regions 22, 23. The first type dopant atoms and the second type dopant atoms are selected such that they have different diffusion coefficients, so that the annealing process results in the first regions 21 having an effective doping concentration of the first doping type and the second regions 22, 23 having an effective doping concentration of the second doping type. In the example shown in FIG. 5B, the first type dopant atoms have a lower diffusion coefficient than the second type dopant atoms, so that the first regions 21 form close to the position of the implanted regions 24 and, therefore, close to the positions of the first and second sidewalls 133, 134, while the second regions 22, 23 are spaced apart from the positions of the former sidewalls 133, 134.

According to one example, the first regions 21 include n-type dopant atoms and the second regions 22, 23 include p-type dopant atoms. According to one example, the n-type dopant atoms include at least one of arsenic (As) atoms or antimony (Sb) atoms and the p-type dopant atoms include boron (B) atoms, so that the first type dopant atoms may include As atoms and/or Sb atoms and the second type dopant atoms may include B atoms. In silicon, B atoms may diffuse up to four times faster than As atoms, for example.

Due to the different diffusion coefficients a segregation of the first type dopant atoms and the second type dopant atoms occurs, resulting in the first regions having an effective doping (net doping) of the first doping type and the second regions 22, 23 having an effective doping the of the second doping type. In addition to the doping atoms of the first doping type, the first regions 21 may include dopant atoms of the second doping type. However, in the first regions 21, the dopant atoms of the first doping type prevail, resulting in an effective doping of the first dopant type. Equivalently, in addition to the dopant atoms of the second doping type, the second regions 22, 23 may include dopant atoms of the first doping type, wherein the dopant atoms of the second doping type prevail.

Referring to FIG. 5B, the narrow regions 23 of the second doping type are those regions formed in the former mesa regions 135. The wide regions 22 are those regions formed in sections of the second layer 140 that fill the former trenches 131.

It may be desirable to precisely adjust the number of first type dopant atoms and the number of second type dopant atoms that are included in the layer arrangement after the annealing process. According to one example, the first semiconductor layer 130 and the second semiconductor layer 140 are essentially "non-doped" so that the number of first type dopant atoms and second type dopant atoms, essentially, is only defined by the implantation process. According to one example, non-doped means that a basic doping concentration of each of the first and second semiconductor layers 130, 140 is less than $1E14 \text{ cm}^{-3}$ or even less than $2E13 \text{ cm}^{-3}$.

After the annealing process, the first regions 21 and the second regions 22, 23 form the drift region 20 of the super junction transistor device. The drift region 20 may include only one first semiconductor layer 130 and one second semiconductor layer 140, which may also be referred to as top layer. A semiconductor body 100 with a drift region 20 of this type is illustrated in FIG. 6.

Figure 6:
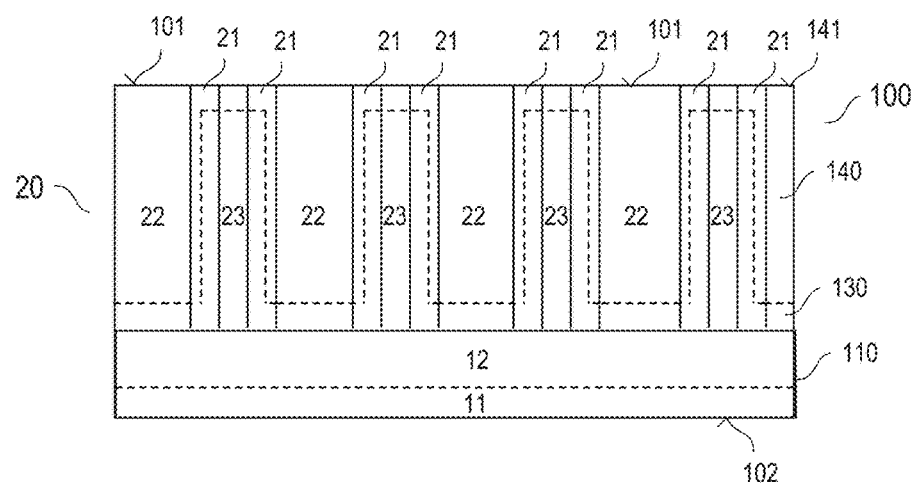
FIG. 6 illustrates one example of a semiconductor body that includes one first semiconductor layer and a top layer.

FIG. 6 illustrates the semiconductor body 100 of the superjunction transistor device after the annealing process and before forming the control structure 3. In this example, the semiconductor body 100 includes a carrier 110 that forms the drain region 11 and the optional buffer region 12, the first semiconductor layer 130 formed on top of the carrier 110, and the second semiconductor layer 140 formed on top of the first semiconductor layer 130. In this exempla, a surface 141 of the second semiconductor layer forms the surface 101 of the semiconductor body 100. According to one example, the first semiconductor layer 130 is epitaxially grown on the carrier 110. The carrier may include a highly doped semiconductor substrate that forms the drain region 11 and, optionally, an epitaxial layer grown on the substrate that forms the buffer region 12.

Forming the drift region 20 based on only one first semiconductor layer 130 and a top layer 140, wherein trenches are formed only in the first semiconductor layer 130 but not the top layer 140 is only an example. Basically, an arbitrary number of first semiconductor layers may be formed on the carrier one above the other, wherein in each of the first semiconductor layers trenches are formed and first and second type dopant atoms are implanted into opposing sidewalls of the trenches before a next one of the first semiconductor layers or the top layer is formed. The result of such process is illustrated in FIG. 7A.

Figure 7A:
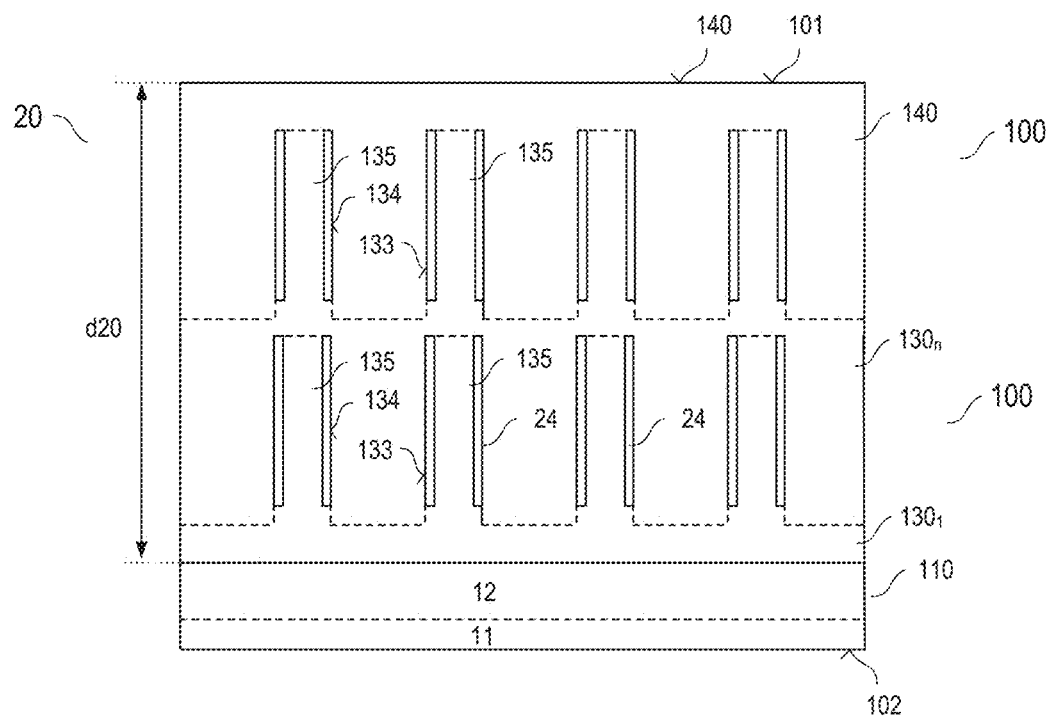
FIGS. 7A and 7B illustrate an example of a semiconductor body that includes several first semiconductor layers and a top layer.

FIG. 7A shows one example of semiconductor body 100 that includes a carrier 110, a plurality of first semiconductor layers $130_1$, $130_n$ formed one above the other on top of the carrier 110, and a top layer 140 formed on an uppermost one $130_n$ of the first semiconductor layers $130_1$, $130_n$. The carrier 110 includes the drain region 11 and the optional buffer region 12, according to one example. The plurality of first semiconductor layers $130_1$, $130_n$ further includes a lowermost layer $130_1$ that is formed on top of the carrier 110. This lowermost semiconductor layer $130_1$ has been processed in the same way as the semiconductor layer 130 explained with reference to FIGS. 4A and 4B. That is, a plurality of trenches were formed in the lowermost semiconductor layer $130_1$ and implanted regions 24 have been formed in mesa regions along opposing sidewalls of the trenches.

The plurality of first semiconductor layers $130_1$, $130_n$ further includes a further semiconductor layer $130_n$. The further semiconductor layer $130_n$ is formed on the lowermost semiconductor layer $130_1$ and fills the trenches in the lowermost semiconductor layer $130_1$. The further semiconductor layer $130_n$ has been processed in the same way as the semiconductor layer 130 shown in FIGS. 4A and 4B. That is, trenches were formed in this semiconductor layer $130_n$ and implanted regions 24 have been produced along opposing sidewalls of these trenches.

In the example shown in FIG. 7A, the semiconductor body includes two first semiconductor layers $130_1$, $130_n$, so that the further semiconductor layer $130_n$ forms the uppermost one of the first semiconductor layers $130_1$, $130_n$ on top of which the top layer 140 has been formed. It goes without saying that an arbitrary number of first semiconductor layers $130_1$, $130_n$, in particular more than 2, more than 5, or more than 10 first semiconductor layers $130_1$-$130_n$ of the same type as the semiconductor layers $130_1$, $130_n$ can be formed one above the other before forming the uppermost layer 140.

Figure 7B:
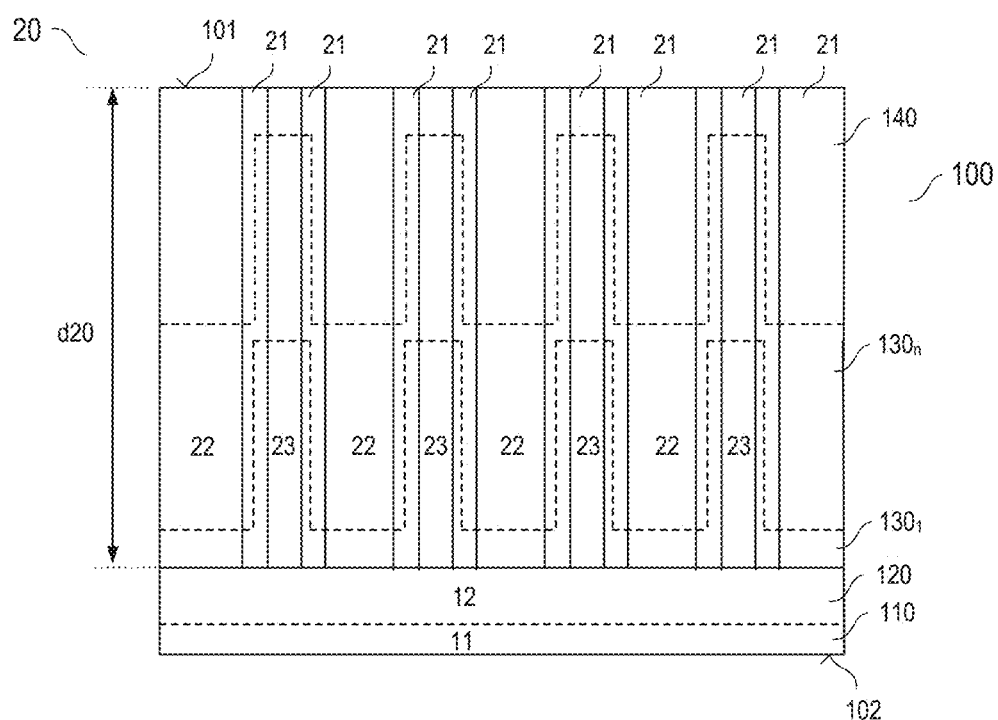

FIG. 7B shows the arrangement shown in FIG. 7A after the annealing process. As can be seen from FIG. 7B, the annealing process results in a plurality of first regions 21 that continuously extend in the vertical direction z, and a plurality of second regions 22, 23 that continuously extend in the vertical direction z of the semiconductor body 100.

In a superjunction transistor device, the voltage blocking capability, is greatly dependent on a length d20 of the drift region 20, wherein the length d20 is the dimension of the drift region 20 in the vertical direction z. Furthermore, a reduction of the pitch of the trench structure, which also results in a reduction of the pitch of the finished superjunction transistor device, may result in a reduction of the on-resistance of the transistor device. On the other hand, reducing the pitch of the trench structure has the effect that, at a given aspect ratio of the trenches, the trenches are produced with a smaller depth d131. If, for example, the trench width w131 equals the mesa width w135 and the aspect ratio of the trenches 131 is 2:1, the trench depth is essentially given by the pitch p of the trench structure (p=w131+w135). Thus, as the pitch p decreases, the number of first semiconductor layers 130 that are to be produced in order to achieve a desired length d20 of the drift region 20 increases. Each additional semiconductor layer, however, adds to the cost of the overall superjunction transistor device.

At a given pitch p of the trench structure and a given aspect ratio a131 of the trenches 131, producing the trenches 131 such that their width w131 is greater than the width w134 of the mesa regions 134 has the effect that, in order to achieve a desired length d20 of the drift region 20, less first semiconductor layers are required as compared to a scenario in which w131=w134. Thus, the method explained herein before is suitable to produce the drift region 20 of a superjunction transistor device in a very cost-efficient way.

Referring to the above, forming the drift region 20 of the superjunction transistor device includes forming at least one first semiconductor layer 130, forming a plurality of trenches 131 in the at least one first semiconductor layer 130, forming implanted regions 24 in mesa regions along opposing sidewalls 134, 135 of the trenches 131, filling the trenches 131 with a semiconductor material, and an annealing process. The implanted regions 24 may be formed in various ways.

Figure 8:
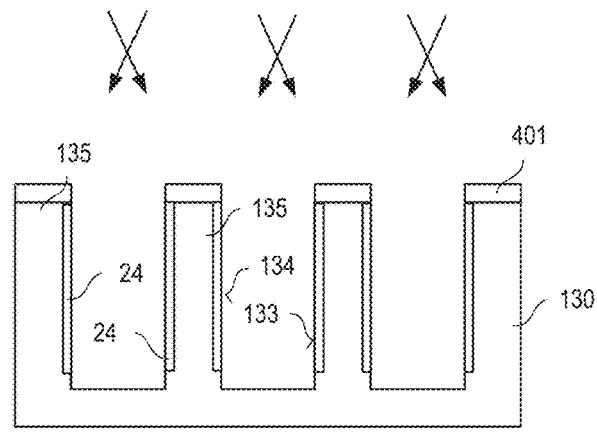
FIG. 8 illustrates one example of a method for implanting first type dopant atoms and second type dopant atoms into sidewalls of trenches in the first semiconductor layer.

According to one example illustrated in FIG. 8, implanting first type dopant atoms and second type dopant atoms into each of the first and second sidewalls 133, 134 includes implanting molecules that include both first type dopant atoms and second type dopant atoms, into the first sidewalls 133 in a first implantation process and into the second sidewalls 134 in a second implantation process.

Figure 9A:
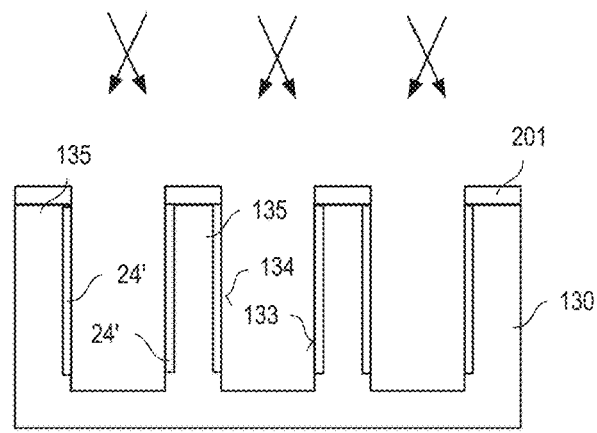
FIGS. 9A and 9B illustrates another example of a method for implanting first type dopant atoms and second type dopant atoms into sidewalls of trenches in the first semiconductor layer.
Figure 9B:
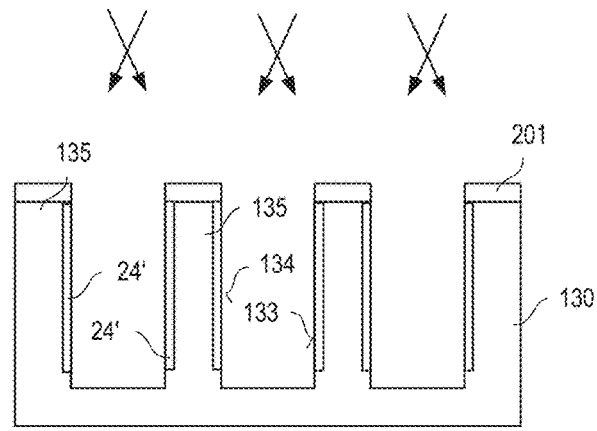

According to another example, the method includes implanting the first type dopant atoms and the second type dopant atoms into one sidewall in separate implantation processes. Referring to FIGS. 9A and 9B this may include implanting first type dopant atoms into the first sidewalls 133 in a first implantation process, implanting first type dopant atoms into the second sidewalls 134 in a second implantation process, as illustrated in FIG. 9A, implanting second type dopant atoms into the first sidewalls 133 in a third implantation process, and implanting the second type dopant atoms into the second sidewalls 134 in a fourth implantation process, as illustrated in FIG. 9B.

Figure 10A:
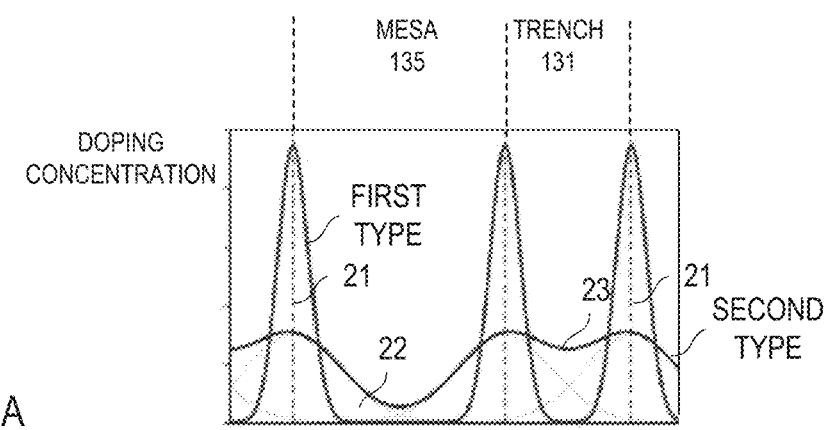
FIGS. 10A-10C illustrates doping profiles of first and second semiconductor regions of a drift region and an associated electric field in blocking state of the transistor device.
Figure 10B:
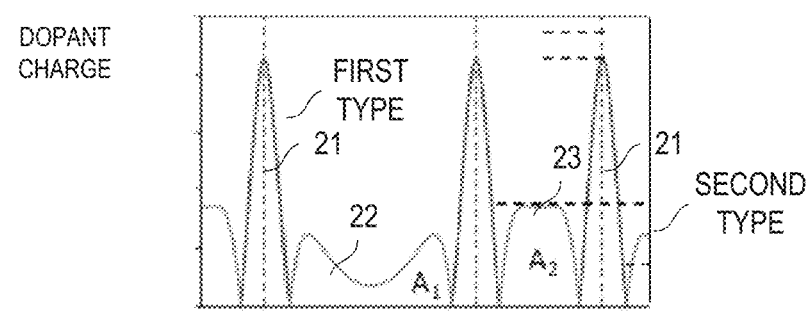
Figure 10C:
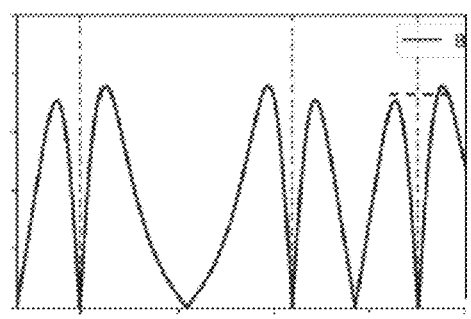

FIGS. 10A-10C illustrates one example of doping concentrations of first type dopant atoms and second dopant atoms in horizontal layers of the drift region 20 after the annealing process (FIG. 10A), the effective first type dopant charge in the first regions 21, and the effective second type dopant charge in the second regions 22, 23 after the annealing process (FIG. 10B), and the electric field strength in the first regions 21 and the second regions 22, 23 in the off-state of the superjunction transistor device when a drain-source voltage Vim is applied (FIG. 10C). The "effective dopant charge" is the integral of the effective doping concentration in vertical planes that are parallel to the pn-junctions formed between the first and second regions 21, 22, 23.

In the example illustrated in FIG. 10, although the transistor device includes wide second regions 22 and narrow second regions 23, the maximum field strength in the individual semiconductor regions 21, 22, 23 is essentially the same. This is highly desirable because this ensures that the voltage blocking capability is essentially the same for pn-junctions formed between first regions 21 and narrow second regions 22, and for pn-junctions formed between first regions 21 and wide second regions 23. This is basically achieved by controlling the annealing process such that an overall number of dopant atoms in the narrow regions 23 essentially equals the overall number of dopant atoms in the wide regions 23. The overall number of dopant atoms is essentially given by the integral of the dopant charge. According to one example, a balancing of the number of dopant atoms in the narrow regions 23 and the wide regions 22 can be achieved by suitably selecting, for example, the duration and the temperature of the annealing process. According to one example, the temperature is selected from between 1050° C. and 1100° C. and the duration is selected from between 250 minutes and 1000 minutes. The duration, for example, may be selected dependent on the pitch of the former trench structure, wherein the larger the pitch the longer the diffusion.

Referring to the above, the carrier 110 may include a semiconductor substrate. This substrate may include oxygen and/or COPs (Crystal Oriented Particles) which may diffuse into the at least one semiconductor layer 130. Oxygen and/or COP diffusing into the at least one semiconductor layer 130 may affect the diffusion of the first type and second type dopant atoms. Thus, according to one example, the conditions (temperature, duration, . . . ) of the temperature process are selected dependent on a concentration of oxygen and/or COPs in the substrate.

Figure 11:
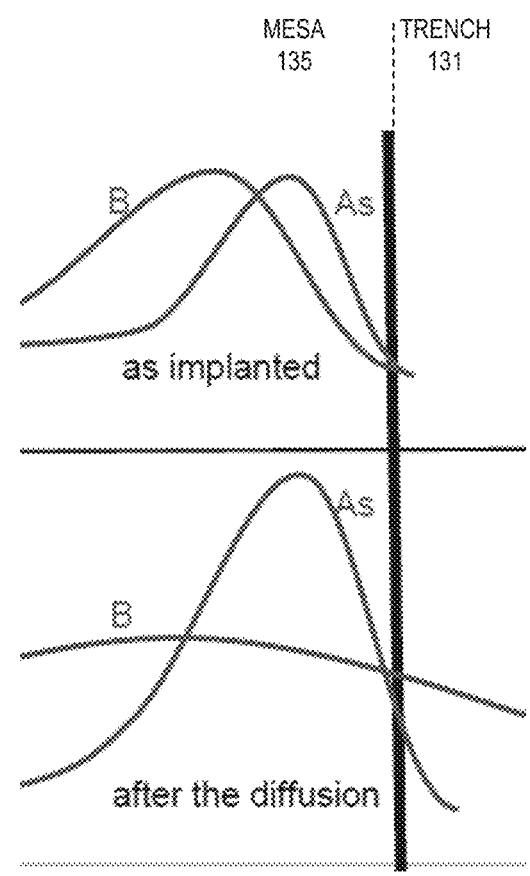
FIG. 11 illustrates doping profiles of first and second semiconductor regions according to another example.

According to one example, the process of forming the second regions 22, 23 such that each of these regions (in the same horizontal layer) essentially has the same number of dopant atoms can be supported by implanting the faster diffusing second type dopant atoms deeper into the first and second sidewalls 133, 134 than the slower diffusion first type dopant atoms. This is illustrated in FIG. 11, which illustrates the concentration of the first type dopant atoms and the second type dopant atoms in the mesa region 135 after the implantation process and after the diffusion process. The implantation depth of the first and second type dopant atoms can be adjusted by suitably adjusting the implantation energy.

The control structure 3, which is only schematically illustrated in FIG. 1, may be implemented in various ways. Some examples are explained in the following. In general, the control structure is formed in the semiconductor body 100 after forming the top layer 140 and is at least partially formed in the top layer. The control structure may be formed after the annealing process that forms the first and second regions 21, 22, 23. According to another example, the control structure 3 is at least partially formed before the annealing process, so that the same annealing process may be used to diffuse and activate dopant atoms of the first and second regions 21, 22, 23 and dopant atoms of doped regions in the control structure.

Figure 12:
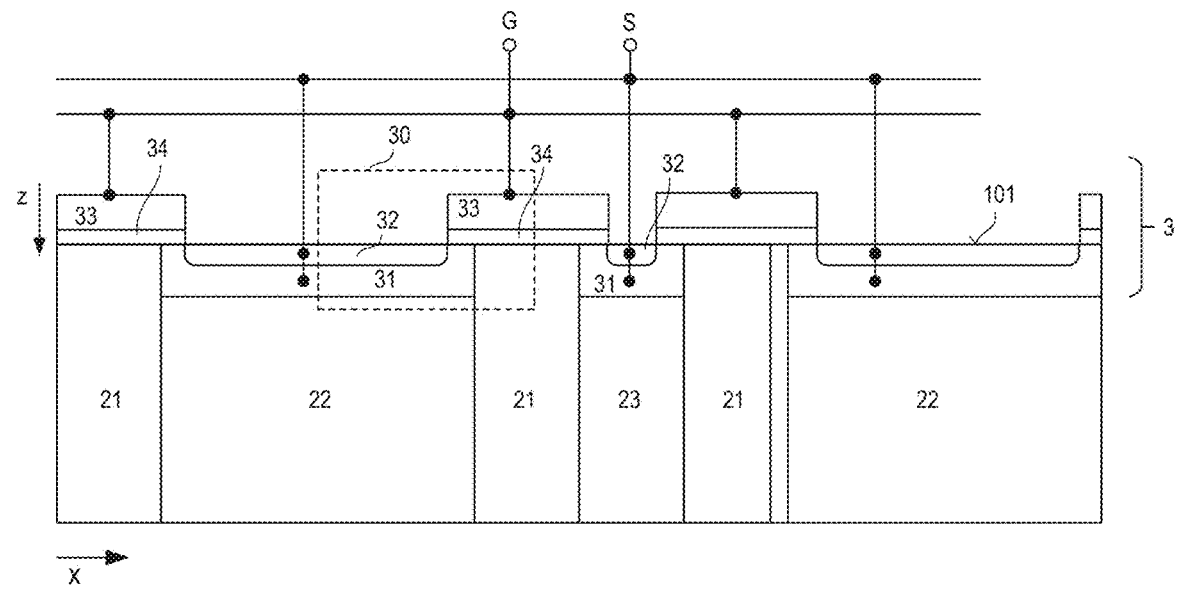
FIG. 12 shows one example of a control structure of the transistor device shown in FIG. 1.

FIG. 12 shows one example of the control structure 3 in a greater detail. Besides the control structure 3, portions of the drift region 20 adjoining the control structure 3 are shown in FIG. 12. In the example shown in FIG. 12 the control structure 3 includes a plurality of control cells 30, which may also be referred to as transistor cells. Each of these control cells 30 includes a body region 31 of the second doping type, a source region 32 of the first doping type, a gate electrode 33, and a gate dielectric 34. The gate dielectric 34 dielectrically insulates that gate electrode 33 from the body region 31. The body region 31 of each control cell 30 separates the respective source region 32 of the control cell 30 from at least one of the plurality of first regions 21. The source region 32 and the body region 31 of each of the plurality of control cells 30 is electrically connected to the source node S. "Electrically connected" in this context means ohmically connected. That is, there is no rectifying junction between the source node S and the source region 32 and the body region 31. Electrical connections between the source node S and the source region 32 and the body region 31 of the individual control cells 30 are only schematically illustrated in FIG. 2. The gate electrode 33 of each control cell 30 is electrically connected to the gate node G.

Referring to the above, the body region 31 of each control cell 30 adjoins at least one first region 21. As the body region 31 is of the second doping type and the first region 21 is of the first doping type there is a pn-junction between the body region 31 of each control cell 30 and the at least one first region 21. These pn-junctions form a portion of the pn-j unction of the control structure 3 that is represented by the bipolar diode in the equivalent circuit diagram of the control structure 3 shown in FIG. 1.

In the example shown in FIG. 2, the gate electrode 33 of each control structure 30 is a planar electrode arranged on top of the first surface 101 of the semiconductor body 100 and dielectrically insulated from the semiconductor body 100 by the gate dielectric 34. In this example, sections of the first regions 21, adjacent the individual body regions 31, extend to the first surface 101.

Figure 13:
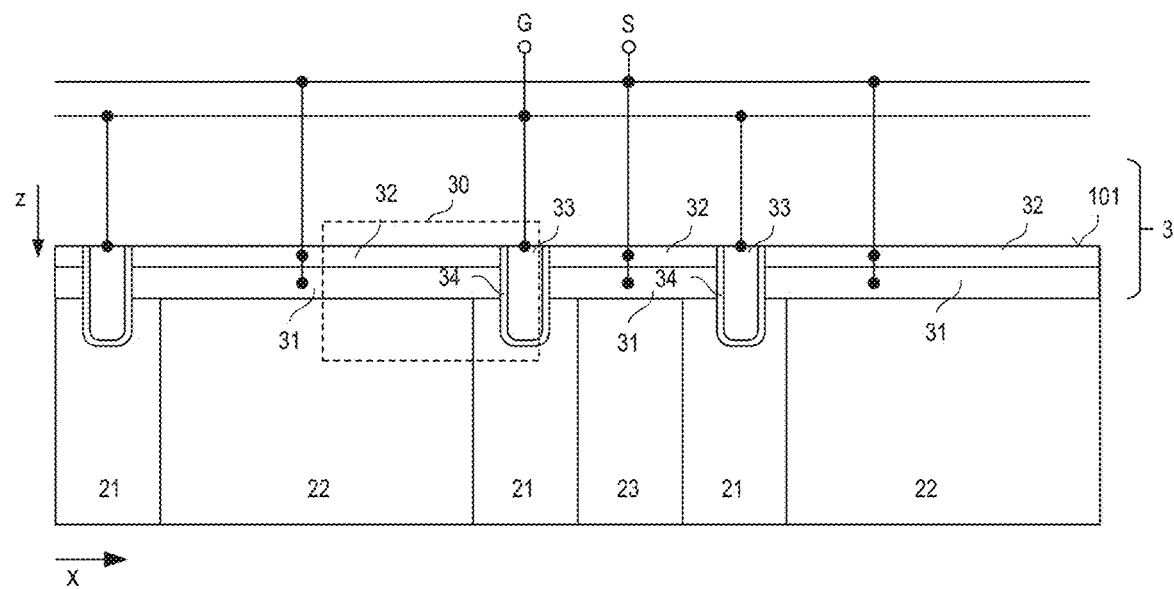
FIG. 13 shows another example of a control structure of the transistor device shown in FIG. 1.

FIG. 13 shows a control structure 3 according to another example. The control structure 3 shown in FIG. 3 is different from the control structure 3 shown in FIG. 2 in that the gate electrode 33 of each control cell 30 is a trench electrode. This gate electrode 33 is arranged in a trench that extends from the first surface 101 into the semiconductor body 100. Like in the example shown in FIG. 2, a gate dielectric 34 dielectrically insulates the gate electrode 33 from the respective body region 31. The body region 31 and the source region 32 of each control cell 30 are electrically connected to the source node S. Further, the body region 31 adjoins at least one first region 21 and forms a pn-j unction with the respective first region 21.

In the examples shown in FIGS. 12 and 13, the control structures 30 each include one gate electrode 33, wherein the gate electrode 33 of each control cell 30 is configured to control a conducting channel between the source region 32 of the respective control cell 30 and one first region 21, so that each control cell 30 is associated with one first region 21. Further, as shown in FIGS. 12 and 13, the body region 31 of each control cell 30 adjoins at least one second region 22, 23, so that the at least one second region 22, 23 is electrically connected to the source node S via the body region 31 of the control cell 30. Just for the purpose of illustration, in the examples shown in FIGS. 2 and 3, the body region 31 of each control cell 30 adjoins one second region 22, 23 so that each control cell 30 is associated with one second region. Furthermore, in the examples, shown in FIGS. 2 and 3, the source regions 32 of two (or more) neighboring control cells 30 are formed by one doped region of the first doping type, the body regions 31 of two (or more) neighboring control cells 30 are formed by one doped region of the second doping type, and the gate electrodes 33 of two (or more) control cells 30 are formed by one electrode. The gate electrodes 33 may include doped polysilicon, a metal, or the like.

According to one example, a doping concentration of the source regions 32 is selected from a range of between 1E18 cm$^{-3}$ and 1E21 cm$^{-3}$, and a doping concentration of the body regions 31 is selected from a range of between 1E16 cm$^{-3}$ and 5E18 cm$^{-3}$.

Associating one control cell 30 of the plurality of control cells with one first region 21 and one second region 22, as illustrated in FIGS. 12 and 13, is only an example. The implementation and the arrangement of the control cells 30 of the control structure 3 are widely independent of the specific implementation and arrangement of the first regions 21 and the second regions 22, 23.

Figure 14:
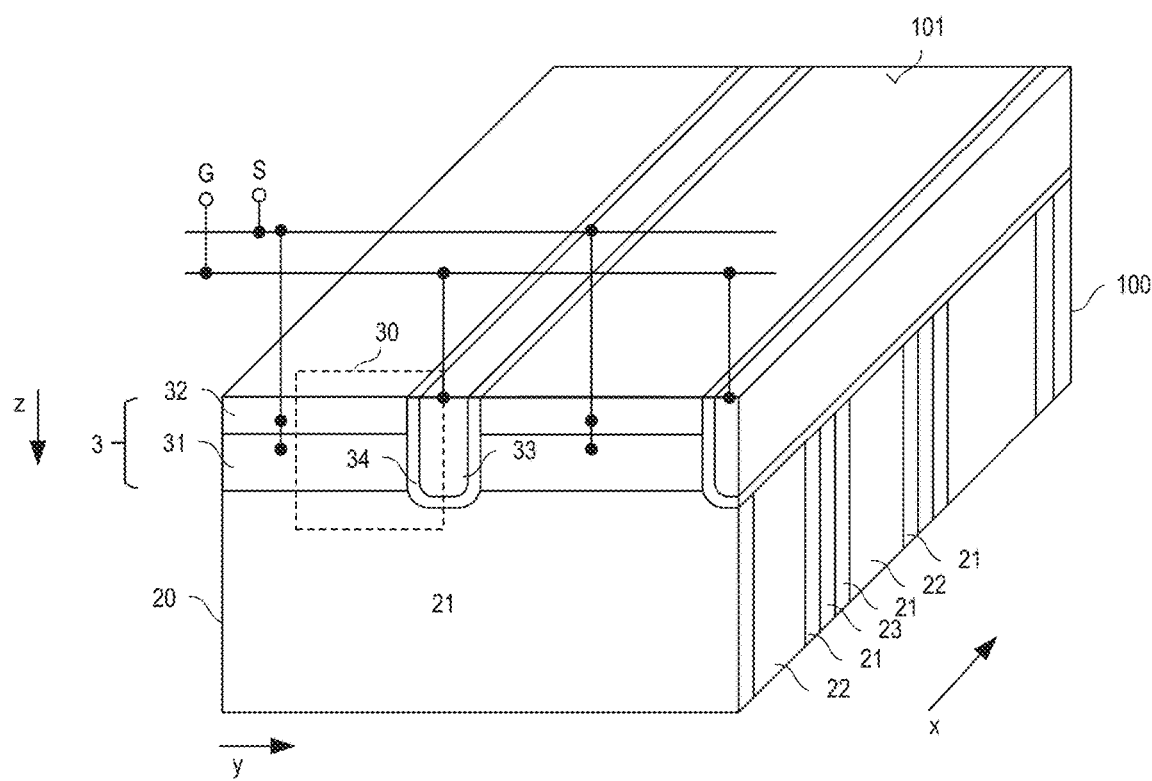
FIG. 14 shows a perspective sectional view of a superjunction transistor device according to another example.

One example illustrating that the implementation and arrangement of the control structure 3 are widely independent of the implementation and arrangement of the first and second regions 21, 22 is shown in FIG. 14. In this example, the first regions 21 and the second regions 22 are elongated in the second lateral direction y of the semiconductor body 100, while the source regions 32, the body regions 31, and the gate electrodes 33 of the individual control cells 30 of the control structure 3 are elongated in the first lateral direction x perpendicular to the second lateral direction y. In this example, the body region 31 of one control cell 30 adjoins a plurality of first regions 21 and second regions 22.

The transistor device can be implemented as an n-type transistor device or as a p-type transistor device. In an n-type transistor device, the first doping type, which is the doping type of the first regions 21, the source regions 32, the drain region 11 and the optional buffer region 12 is an n-type and the second doping type, which is the doping type of the second regions 22, 23 and the body regions 31, is a p-type. In a p-type transistor device, the doping types of the device regions mentioned before are complementary to the doping types of the respective device regions in an n-type transistor device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   forming a plurality of first regions of a first doping type and a plurality of second regions of a second type in a semiconductor body such that the first regions and the second regions are arranged alternatingly in the semiconductor body,
   wherein forming the first regions and the second regions comprises:
   forming a plurality of trenches in at least one semiconductor layer;
   implanting first type dopant atoms and second type dopant atoms into each of opposing sidewalls of the plurality of trenches;
   filling the plurality of trenches with a semiconductor material; and
   diffusing the first type dopant atoms and the second type dopant atoms in a thermal process so that the first type dopant atoms form the first regions and the second type dopant atoms form the second regions,
   wherein each of the plurality of trenches has a first width,
   wherein the trenches are separated by mesa regions each having a second width,
   wherein the first width is greater than the second width,
   wherein the second type dopant atoms are implanted deeper into the sidewalls than the first type dopant atoms, and
   wherein the second type dopant atoms are faster diffusing than the first type dopant atoms.

2. The method of claim 1, wherein the first width is at least 1.05 times the second width.

3. The method of claim 1, wherein the first width is less than 3 times the second width.

4. The method of claim 1, wherein an aspect ratio of the trenches is between 2:1 and 3:1.

5. The method of claim 1, wherein the first type dopant atoms comprise at least one of arsenic and antimony atoms, and wherein the second type dopant atoms comprise boron atoms.

6. The method of claim 1, wherein an overall amount of the first type dopants implanted into each of the sidewalls deviates less than 5% from an overall amount of the second type dopant atoms implanted into the respective sidewall.

7. The method of claim 1, wherein filling the trenches comprises forming an epitaxial layer in the trenches and on top of the mesa regions.

8. The method of claim 1, wherein forming the plurality of trenches in the at least one semiconductor layer comprises:
   forming a plurality of semiconductor layers one above the other; and
   forming a plurality of trenches in each of the plurality of semiconductor layers before forming a next one of the plurality of semiconductor layers.

9. The method of claim 1, further comprising:
   forming a control structure with a plurality of source regions of the first doping type and a plurality of body regions of the second doping type such that each of the first regions adjoins at least one of the plurality of body regions and each of the second regions adjoins at least one of the plurality of body regions.

* * * * *